(12) United States Patent
Pan et al.

(10) Patent No.: US 7,237,177 B2
(45) Date of Patent: Jun. 26, 2007

(54) METHOD OF CALCULATING INTERNAL SIGNALS FOR USE IN A MAP ALGORITHM

(75) Inventors: Ju Yan Pan, Singapore (SG); Hiroshi Katsuragawa, Kawasaki (JP)

(73) Assignee: Oki Techno Centre (Singapore) Pte Ltd, Singapore (SG)

( * ) Notice: Subject to any disclaimer, the term of this patent is extended or adjusted under 35 U.S.C. 154(b) by 404 days.

(21) Appl. No.: 10/727,910

(22) Filed: Dec. 4, 2003

(65) Prior Publication Data
US 2004/0158590 A1  Aug. 12, 2004

(30) Foreign Application Priority Data
Dec. 5, 2002 (SG) .............................. 200207437-5

(51) Int. Cl.
*G11C 29/00* (2006.01)
(52) U.S. Cl. .................. 714/769; 714/769; 714/795
(58) Field of Classification Search ................ 714/795, 714/794, 800, 724, 723, 791, 798, 769
See application file for complete search history.

(56) References Cited

U.S. PATENT DOCUMENTS

| | | | | |
|---|---|---|---|---|
| 6,101,223 A | * | 8/2000 | Betts ........................ | 375/261 |
| 6,757,701 B2 | * | 6/2004 | Sivan et al. ................ | 708/277 |
| 6,999,531 B2 | * | 2/2006 | Jin ............................ | 375/341 |
| 2001/0021971 A1 | * | 9/2001 | Gibson et al. ............. | 712/215 |
| 2001/0031024 A1 | * | 10/2001 | Petersen et al. ........... | 375/335 |

OTHER PUBLICATIONS

Berrou, et al., "Near Shannon Limit Error-Correcting Coding and Decoding:Turbo-Codes," in Proceedings of ICC'93, Geneva, Switzerland, pp. 1064-1070, May 23-25, 1993.

Warren J. Gross and P. Glenn Gulak, Simplified MAP Algorithm Suitable for Implementation of Turbo Decoders, Department of Electrical and Computer Engineering, University of Toronto, Toronto, Canada.
Chass, et al., "Efficient Software Implementation of the Max-Log-MAP Turbo Decoder on the StarCore SC140 DSP," Motorola Semiconductor Israel Ltd, Shenkar 1, Herzelia, Israel.
Patrick Robertson and Peter Hoeher, Optimal and Sub-Optimal Maximum a Posteriori Algorithms Suitable for Turbo Decoding, European Transactions on Telecommunications, vol. 8, No. 2, Mar.-Apr. 1997, pp. 119-125.
EG TS 25:212 V3.3.0 (Jun. 2000)), 3rd Generation Partnership Project; Technical Specification Group Radio Access Network; Multiplexing and channel coding (FDD) (Release 1999) pp. 1-62.
IEEE Transactions on Information Theory, Mar. 1974, pp. 284-287.

* cited by examiner

*Primary Examiner*—Albert Decady
*Assistant Examiner*—Fritz Alphonse
(74) *Attorney, Agent, or Firm*—Quarles & Brady LLP

(57) ABSTRACT

A method of calculating internal signals for use in a MAP algorithm is disclosed, comprising the steps of:
  obtaining first decoding signals by processing received systematic and received encoded symbols of each symbol sequence of a received signal;
  obtaining unnormalized second decoding signals for the current symbol sequence by processing the first decoding signals of the previous sequence and second decoding signals of the previous sequence;
  obtaining unnormalized third decoding signals for the current symbol sequence by processing the first decoding signals of the current sequence and third decoding signals of the next sequence;
  normalizing the unnormalized second and third decoding signals; and
  wherein at least one of said second decoding signals of the previous sequence and said third decoding signals of the next sequence are unnormalised.

15 Claims, 3 Drawing Sheets

METHOD OF CALCULATING INTERNAL SIGNALS FOR USE IN A MAP ALGORITHM

FIELD OF THE INVENTION

This invention relates to the method for calculating internal signals used in a MAP algorithm, more particularly, but not exclusively, for use in the max-log-MAP (maximum a posteriori) algorithm.

BACKGROUND OF THE INVENTION

The max-log-MAP decoding algorithm is a simplified version of the MAP decoding algorithm, which is also known as the BCJR decoding algorithm. The max-log-MAP is used to decode a convolutional encoder. It is one of the more popular soft output decoding methods.

A main application of the max-log-MAP decoder is in the decoding of turbo codes, which are generated using two parallel concatenated convolutional encoders. Two max-log-MAP decoders are used as component decoders in the turbo decoder. Today, turbo codes have become established as an important method of channel coding in the third generation wireless mobile communication technical specification. However, as time progresses and demand for high data rate communication increases, the turbo decoder is burdened with the task of performing with very high processing speed. Improving the speed of the component decoders of the turbo decoder, i.e. the max-log-MAP decoders, is the key to increasing turbo decoding speed.

The conventional max-log-MAP algorithm will now be described.

At the input of the max-log-MAP decoder are two kinds of received signals: received systematic symbols X and received coded symbols Y. A third possible kind of input signal is a lambda $\lambda$ signal from the previous max-log-MAP decoder output if iterative decoding (turbo decoding) is applied. These signals are used to compute lambda, or in the case of turbo decoding, new lambda values. Several important internal signals of the max-log-MAP are defined: $\alpha$, $\beta$, and Y.

$\alpha$ and $\beta$ are computed recursively—i.e. the computation of the internal signal $\alpha$ or $\beta$ at a symbol sequence t needs the value of the internal signal from the previous, for $\alpha$, or following, for $\beta$, symbol sequence (t−1 or t+1).

There are two types of Y values: $Y^0$ is associated with the probability of a systematic symbol X being bit 0, while $Y^1$ is associated with the probability of the systematic symbol being bit 1. Y is computed using X, Y and the lambda from the previous max-log-MAP decoder output, denoted by $\lambda p$.

Signal Y is calculated according to a trellis diagram. Table 1 gives and example of how Y0 and Y1, given states m, are calculated in an 8-state recursive systematic convolutional (RSC) encoder with the following transfer function: [1, $g_1(D)/g_0(D)$] where $g_0(D)=1+D^2+D^3$ and $g_1=1+D+D^3$. In the above polynomials, the Ds describe a set of different Hamming distances (with respect to all zeros) that can be obtained from a convolutional encoder. Note that, 1 actually referes to $D^0$ (Hamming distance of 0). Here, an 8-state RSC encoder is taken as an example. In fact, m can be other states, such as 16 states or 32 states, depending on the application.

TABLE 1

Example of Y values for states m

| m | $Y^0_t(m)$ | $Y^1_t(m)$ |
|---|---|---|
| 0 | $-Y_t - (X_t + \lambda^P_t)$ | $+Y_t + (X_t + \lambda^P_t)$ |
| 1 | $-Y_t - (X_t + \lambda^P_t)$ | $+Y_t + (X_t + \lambda^P_t)$ |
| 2 | $+Y_t - (X_t + \lambda^P_t)$ | $-Y_t + (X_t + \lambda^P_t)$ |
| 3 | $+Y_t - (X_t + \lambda^P_t)$ | $-Y_t + (X_t + \lambda^P_t)$ |
| 4 | $+Y_t - (X_t + \lambda^P_t)$ | $-Y_t + (X_t + \lambda^P_t)$ |
| 5 | $+Y_t - (X_t + \lambda^P_t)$ | $-Y_t + (X_t + \lambda^P_t)$ |
| 6 | $-Y_t - (X_t + \lambda^P_t)$ | $+Y_t + (X_t + \lambda^P_t)$ |
| 7 | $-Y_t - (X_t + \lambda^P_t)$ | $+Y_t + (X_t + \lambda^P_t)$ |

The $\alpha$ for symbol sequence t and states m (total eight different states) is calculated using $\alpha$ and Y at t−1 from two different states ($m^0$ and $m^1$). This is done by first computing an unnormalized signal $\underline{\alpha}$ $$\underline{\alpha}_t(m) = \text{max-of-2}\{\alpha_{t-1}(m^0) + Y^0_{t-1}(m^0), \alpha_{t-1}(m^1) + Y^1_{t-1}(m^1)\} \quad (1)$$

Using the example of the same RSC encoder used in Table 1, Table 2 gives the values of $m^0$ and $m^1$ corresponding to m, wherein states $m^0$ and $m^1$ are selected arbitrarily from eight different states m.

The initial values $\underline{\alpha}_0(m)$ are set to appropriate constants. Usually, $\underline{\alpha}_0(0)$ is set to 0 and $\{\underline{\alpha}_0(1), \underline{\alpha}_0(2), \ldots, \underline{\alpha}_0(7)\}$ are set to a large negative number, for example, −128.

TABLE 2

Example of $m^0$ and $m^1$ values corresponding to m for $\alpha$ computation

| M | $m^0$, $m^1$ |
|---|---|
| 0 | 0, 1 |
| 1 | 3, 2 |
| 2 | 4, 5 |
| 3 | 7, 6 |
| 4 | 1, 0 |
| 5 | 2, 3 |
| 6 | 5, 4 |
| 7 | 6, 7 |

After all eight states are computed, all $\underline{\alpha}$ values are normalized by subtracting a constant $A_t$.

$$\alpha_t(m) = \underline{\alpha}_t(m) - A_t \quad (2)$$

$A_t$ is a function of at $\alpha_t$ which can be obtained in several ways. Some of them are $$A_t = \text{max-of-8}\{\underline{\alpha}_t(m)\}_{m \in \{0,1,\ldots,7\}} \quad (3a)$$

$$A_t = (\text{max-of-8}\{\underline{\alpha}_t(m)\}_{m \in \{0,1,\ldots,7\}} + \text{min-of-8}\{\underline{\alpha}_t(m)\}_{m \in \{0,1,\ldots,7\}})/2 \quad (3b)$$

$$A_t = \underline{\alpha}_t(0) \quad (3c)$$

Similarly, $\beta$ is computed using information from different states ($m^0$ and $m^1$) and the symbol sequence t+1, and using Y from states m at sequence t.

First, the unnormalized $\underline{\beta}$ is computed $$\underline{\beta}_t(m) = \text{max-of-2}\{\beta_{t+1}(m^0) + Y^0_t(m), \beta_{t+1}(m^1) + Y^1_t(m)\} \quad (4)$$

Table 3 gives the values of $m^0$ and $m^1$ corresponding to m, using the same RSC encoder.

The initial value $\underline{\beta}_{L+1}(0)$, where L is the frame size, is usually set to 0, while $\{\underline{\beta}_{L+1}(1), \underline{\beta}_{L+1}(2), \ldots, \underline{\beta}_{L+1}(7)\}$ are usually set to a large negative number, for example, −128.

TABLE 3

Example of $m^0$ and $m^1$ values
corresponding to m for β computation

| m | $m^0$, $m^1$ |
|---|---|
| 0 | 0, 4 |
| 1 | 4, 0 |
| 2 | 5, 1 |
| 3 | 1, 5 |
| 4 | 2, 6 |
| 5 | 6, 2 |
| 6 | 7, 3 |
| 7 | 3, 7 |

After all 8 states are computed, all β values are normalized by subtracting a constant $B_t$ which is obtained in the similar way as $A_t$ $$\beta_t(m) = \underline{\beta}_t(m) - B_t \quad (5)$$

Lambda is computed using α, β and Y of all states. The $m^0$ and $m^1$ states for β are the same as given in Table 3.

$$\lambda_t = \text{max-of-8}\{\alpha_t(m) + Y^1_t(m) + \beta_{t+1}(m^1)\}_{m \in \{0,1,\ldots,7\}} - \text{max-of-8}\{\alpha_t(m) + Y^0_t(m) + \beta_{t+1}(m^0)\}_{m \in \{0,1,\ldots,7\}} \quad (6)$$

As can be seen from the equations, two or more symbols of α or β cannot be computed in parallel, and therefore must be computed in sequence. However, the sequential computation of α can run in parallel with the sequential computation of β. Therefore, as α and β have exactly the same complexity and are independent of each other, from this point, the α and β computations are referred as a single entity called α/β computations, for convenience sake.

Lambda computations, however, are not independent of α/β computations. The lambda computation for symbol sequence t cannot begin until α and β of symbol sequence t are computed.

Looking at the algorithm for computing α/β for symbol sequence t (equations (1)–(5)), it can be seen that the algorithm can be divided into four dependent sequential stages. In other words, one stage cannot begin until the previous has been completed. For example, to compute α for symbol sequence t, the four stages S1(t)–S4(t) are S1(t): Compute $Y^0_{t-1}(m^0)$ and $Y^1_{t-1}(m^1)$ using Table 1
S2(t): Compute $\underline{\alpha}_t(m)$ using equation (1)
S3(t): Compute $A_t$ using one of the equations (3a), (3b), (3c)
S4(t): Compute $\alpha_t(m)$ using equation (2)

It is possible to implement pipelining by starting S2 for the next symbol sequence t+1 after S4(t). This is because S1(t) is independent of any stage at any symbol sequence. FIG. 1 illustrates an example of the timeline of such an implementation, with the assumption that the length of time taken for the stages S1–S4 follows the proportion of T1:T2:T3:T4=1:1:1.5:0.5.

In general, the length of time taken to complete the stages given L number of symbols is $$T = T1 + L(T2 + T3 + T4) \quad (7)$$

Using the prior art, the pipelining implementation is limited by the normalization computation (S3 and S4). In other words, part of the computation (referring to S2) of symbol sequence t+1 can begin only after the normalization computation in symbol sequence t is completed.

One way to improve this is to forgo the normalization computation for a few symbols (normalization can never be completely eliminated because it is needed to prevent overflow), but this would produce different results and slightly increase the number of bits which are set aside for the internal signals.

It is an object of the invention to provide a method of calculating decoding signals that can improve the pipelining implementation.

SUMMARY OF THE INVENTION

In accordance with the present invention, there is provided a method of calculating internal signals for use in a MAP algorithm, comprising the steps of: obtaining first decoding signals by processing received systematic and received encoded symbols of each symbol sequence of a received signal; obtaining unnorinalized second decoding signals for the current symbol sequence by processing the first decoding signals of the previous sequence and second decoding signals of the previous sequence; obtaining unnormalized third decoding signals for the current symbol sequence by processing the first decoding signals of the current sequence and third decoding signals of the next sequence; normalizing the unnormalized second and third decoding signals; and wherein at least one of said second decoding signals of the previous sequence and said third decoding signals of the next sequence are unnormalised.

Preferably, said first decoding signals are of two types, one type being associated with the probability of a said systematic symbol being 0 and the other type being associated with the probability of a said systematic symbol being 1.

Preferably, the step of obtaining current unnormalized second decoding signals is implemented by:

$$\underline{\alpha}_t(m) = \text{max-of-2}\{\underline{\alpha}_{t-1}(m^0) + Y^0_{t-1}(m^0), \underline{\alpha}_{t-1}(m^1) + Y^1_{t-1}(m^1)\} - A_{t-1}$$

where $\underline{\alpha}_t(m)$ are said current unnormalized second decoding signals for states m, $\underline{\alpha}_{t-1}(m^0)$ and $\underline{\alpha}_{t-1}(m^1)$ are respectively said prior unnormalized second decoding signals, for states $m^0$ and $m^1$, $Y^0_{t-1}(m^0)$ and $Y^1_{t-1}(m^1)$ are respectively said two types of said prior first decoding signals for states $m^0$ and $m^1$, $A_{t-1}$ is a second decoding signal constant for a previous time period, wherein said states $m^0$ and $m^1$ are selected from said states m.

Preferably, the step of normalizing said second decoding signal comprises the step of calculating:

$$\alpha_t(m) = \underline{\alpha}_t(m) - A_t$$

where, $\alpha_t(m)$ are said current second decoding signals for states m, $\underline{\alpha}_t(m)$ are said unnormalized second decoding signals for states m, $A_t$ is a second decoding signal constant for the current period.

Preferably, the step of obtaining current unnormalized second decoding signals is implemented by:

$$\underline{\alpha}_t(m) = \text{max-of-2}\{\underline{\alpha}_{t-1}(m^0) + Y^0_{t-1}(m^0), \underline{\alpha}_{t-1}(m^1) + Y^1_{t-1}(m^1)\}$$

where $\underline{\alpha}_t(m)$ are said current unnormalized second decoding signals for states m, $\underline{\alpha}_{t-1}(m^0)$ and $\underline{\alpha}_{t-1}(m^1)$ are respectively said prior unnormalized second decoding signals, for states $m^0$ and $m^1$, $Y^0_{t-1}(m^0)$ and $Y^1_{t-1}(m^1)$ are respectively said two types of said prior first decoding signals for states $m^0$ and $m^1$, wherein said states $m^0$ and $m^1$ are selected from said states m.

Preferably, said step of normalizing said current second decoding signal comprises the step of calculating:

$$\alpha_t(m) = \underline{\alpha}_t(m) - A_t - (A_1 + A_2 + \ldots + A_{t-1})$$

where, $\alpha_t(m)$ is said current second decoding signals for states m, $\underline{\alpha}_t(m)$ is said unnormalized second decoding signals for states m, and $A_1, A_2, \ldots, A_{t-1}$ and $A_t$ are respectively second decoding signal constants for the first to current periods.

Preferably, said second decoding signal constant for the current period $A_t$ is one of:

$A_t$=max-of-all states $\{\underline{\alpha}_t(m)\}$
$A_t$=(max-of-all states $\{\underline{\alpha}_t(m)\}$+min-of-all states $\{\underline{\alpha}_t(m)\}$)/2
$A_t = \underline{\alpha}_t(0)$ where $\underline{\alpha}_t(m)$ is said unnormalized second decoding signals for states m.

The method of the present invention preferably further comprises a step of setting the initial values of said unnormalized second decoding signals to selected constants.

Preferably, the step of obtaining said unnormalized third decoding signals is implemented by:

$$\underline{\beta}_t(m) = \text{max-of-2}\{\underline{\beta}_{t+1}(m^0) + Y^0_t(m), \\ \underline{\beta}_{t+1}(m^1) + Y^1_t(m)\} - B_{t-1}$$

where $\underline{\beta}_t(m)$ are the current unnormalized third decoding signals for states m, $\underline{\beta}_{t+1}(m^0)$ and $\underline{\alpha}_{t+1}(m^1)$ are respectively two values of the future unnormalized third decoding signals for states $m^0$ and states $m^1$, $Y^1_t(m)$ and $Y^1_t(m)$ are respectively said two types of said current first decoding signals for states m, $B_{t-1}$ is a third decoding signal constant for a prior period and said states $m^0$ and $m^1$ are selected from said states m.

Preferably, said step of normalizing said third decoding signals is implemented by calculating $$\beta_t(m) = \underline{\beta}_t(m) - B_t$$

where, $\beta_t(m)$ are the current third decoding signals for states m, $\underline{\beta}_t(m)$ are the current unnormalized third decoding signals for states m, and $B_t$ is the current third decoding signal constant.

Preferably, the step of obtaining said unnormalized third decoding signals is implemented by:

$$\underline{\beta}_t(m) = \text{max-of-2}\{\underline{\beta}_{t+1}(m^0) + Y^0_t(m), \underline{\beta}_{t+1}(m^1) + Y^1_t(m)\}$$

where $\underline{\beta}_t(m)$ are the current unnormalized third decoding signals for states m, $\underline{\beta}_{t+1}(m^0)$ and $\underline{\beta}_{t+1}(m^1)$ are respectively two values of the future unnormalized third decoding signal for states m0 and m1, $Y^0_t(m)$ and $Y^1_t(m)$ are respectively said two types of the current first decoding signals, wherein said states $m^0$ and $m^1$ are selected from said states m.

Said step of normalizing said third decoding signal may comprise the step of calculating $$\beta_t(m) = \underline{\beta}_t(m) - B_t - (B_1 + B_2 + \ldots + B_{t-1})$$

where, $\beta_t(m)$ are the current third decoding signal for states m, $\underline{\beta}_t(m)$ are unnormalized third decoding signal for states m, and $B_1, B_2, \ldots, B_{t-1}$ and $B_t$ are respectively third decoding signal constants for the first to current periods;

The third decoding signal constant $B_t$ for the current period may be:

$B_t$=max-of-all states $\{\underline{\beta}_t(m)\}$
$B_t$=(max-of-all states $\{\underline{\beta}_t(m)\}$+min-of-all states $\{\underline{\beta}_t(m)\}$)/2
$B_t = \underline{\beta}_t(0)$ Where $\underline{\beta}_t(m)$ are the current unnormalized third decoding signals for states m.

The method of the present invention preferably further comprises a step of setting the initial values of said unnormalized third decoding signals to selected constants.

Preferably, both of said second decoding signals of the previous sequence and said third decoding signals of the next sequence are unnormalised.

Preferably, the calculation of the internal signals is pipelined whereby the calculation for the next symbol sequence is commenced once the unnormalized signals for the current symbol sequence have been calculated.

The described embodiment of the invention is a modification of the calculations of decoding signals α and/or β in algorithm to allow for an improved pipelining implementation and allows S2(t+1) to be independent of the normalization in t, and can begin computation as soon as S2(t) is completed. The described embodiment also retains the same final values of the internal signals (the values after S4) as the prior art.

BRIEF DESCRIPTION OF THE DRAWINGS

Embodiments of the invention will now be described, by way of example, with reference to the accompanying drawings, in which.

Figure 1:
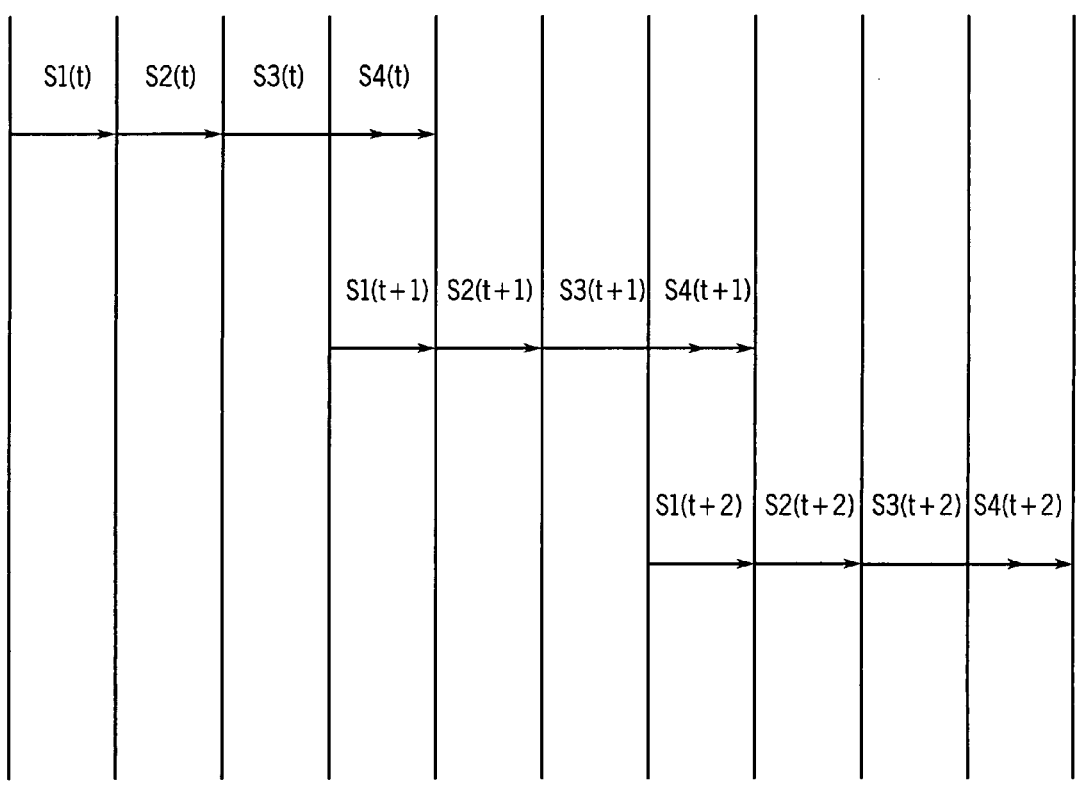
FIG. 1 illustrates a prior art timing diagram of the four stages of α/β computation for three symbols in a pipelining implementation.

DETAILED DESCRIPTION OF THE
PREFERRED EMBODIMENTS OF THE
INVENTION

The embodiments of the invention use modified max-log-MAP algorithms and a first embodiment will now be described.

In the modified algorithm, the computations for α/β are modified so that pipelining implementation can be faster than that of the prior art. The main feature is to make the computation of $\underline{\alpha}/\underline{\beta}$ of symbol sequence t+1 independent of the normalization of $\underline{\alpha}/\underline{\beta}$ of symbol sequence t.

Equation (1) is modified so that $\underline{\alpha}_t(m)$ is computed using unnormalized values $\underline{\alpha}_{t-1}(m)$ instead of normalized values $\alpha_{t-1}(m)$, and a normalized constant $A_{t-1}$ is added.

$$\underline{\alpha}_t(m) = \text{max-of-2}\{\underline{\alpha}_{t-1}(m^0) + Y^0_{t-1}(m^0), \\ \underline{\alpha}_{t-1}(m^1) + Y^1_{t-1}(m^1)\} - A_{t-1} \quad (8)$$

Equation (2) remains the same.

$$\alpha_t(m) = \underline{\alpha}_t(m) - A_t \quad (9)$$

Similarly, equations (4) and (5) are modified to $$\underline{\beta}_t(m) = \text{max-of-2}\{\underline{\beta}_{t+1}(m^0) + Y^0_t(m), \\ \underline{\beta}_{t+1}(m^1) + Y^1_t(m)\} - B_{t-1} \quad (10)$$

$$\beta_t(m) = \underline{\beta}_t(m) - B_t \quad (11)$$

The final values of $\alpha_t$ and $\beta_t$ are still exactly the same as the prior art.

Following these modifications, the four dependent sequential stages described in the prior art are now slightly different. For example, to compute α for symbol sequence t, the four stages of the modified equations S1m(t)–S4m(t) are S1m(t): Compute $Y^0_{t-1}(m^0)$ and $Y^1_{t-1}(m^1)$ using Table 1

S2m(t): Compute $\underline{\alpha}_t(m)$ using equation (8) ($A_{t-1}$ being known from the previous iteration)

S3m(t): Compute $A_t$ using one of the equations (3a), (3b), (3c)

S4m(t): Compute $\alpha_t(m)$ using equation (9)

Compared with the prior art, the length of time taken for these modified stages is almost the same. S1 and S1m take exactly the same computation time, and so do the pair S3 and S3m and the pair S4 and S4m. The length of time taken for stage S2m is slightly increased compared with S2, because S2m further subtracts the constant $A_{t-1}$.

As in the prior art, it is possible to implement pipelining by starting S2 for the next symbol sequence t+1 after S4(t). This is because S1(t) is independent of any stage at any symbol sequence. FIG. 1 illustrates an example of the timeline of such an implementation, with the assumption that the length of time taken for the stages S1–S4 follows the ratio 1:1:1.5:0.5.

Figure 2:
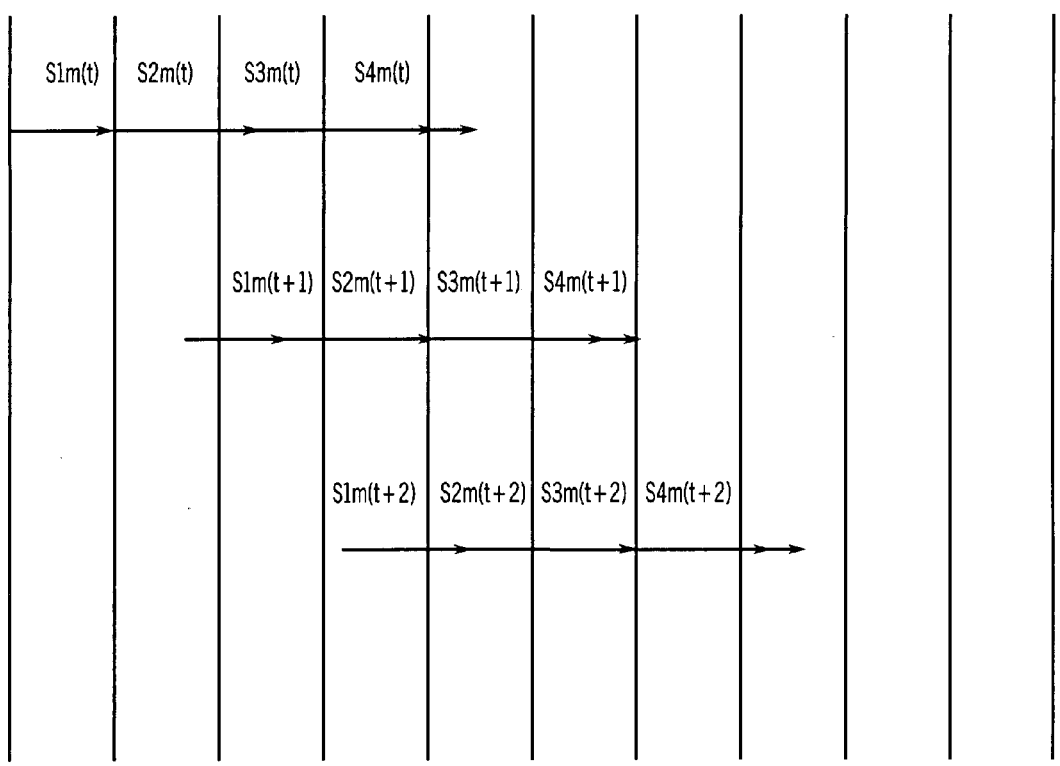
FIG. 2 illustrates a timing diagram of the four stages of α/β computation for three symbols in a pipelining implementation according to a first embodiment of the invention.

However, the pipelining implementation can now be improved because S2m(t+1) can begin after S2m(t). This is because the normalization computations have been deferred. FIG. 2 illustrates an example of the timeline of the improved pipelining implementation according to the first embodiment of the present invention, with the assumption that the length of time taken for the stages S1m–S4m follows the proportion of T1m:T2m:T3m:T4m=1:1.5:1.5:0.5, which is the same as the assumption given in the prior art description except for the second stage.

Stage 2 can start immediately after the end of the previous stage 2. Therefore, in general, the length of time taken to complete the stages given L number of symbols is $$Tm = T1m + T2m + (T3m + T4m) + (L-1) \times (T2m + T3m + T4m - T3m - T4m) \qquad (12)$$
$$= T1m + L \times T2m + T3m + T4m$$

By comparing with the prior art, we can substitute T1=T1m, T2=T2m/1.5, T3=T3m, and T4=T4m, and obtain $$T = T1m + L(T2m/1.5 + T3m + T4m) \qquad (13)$$

The number of times of improvement in speed compared with the prior art is $$T/Tm = (T1m + L(T2m/1.5 + T3m + T4m))/(T1m + L \times T2m + T3m + T4m) \qquad (14)$$

For there to be an improvement in speed, the ratio T/Tm must be more than one. Further simplification of T/Tm>1 yields $$L > 1 + T2m/(3 \times T3m + 3 \times T4m - T2m) \qquad (15)$$

It can be seen from equation (15) that there will be an improvement in speed as long as the frame size is not one, as $T2m/(3 \times T3m + 3 \times T4m - T2m)$ is likely to be less than one. Practically, this means that there will be an improvement at any frame size.

Using the example of T1m:T2m:T3m:T4m=1:1.5:1.5:0.5 in equation (14), the number of times of improvement in speed approaches 2 for large L.

However, the improvement should be smaller in the case where S3 is computed using a more complex method such as in equations (3a) and (3b), because a relatively small T3 produces a small T/Tm ratio.

In a second embodiment, the algorithm described as the first embodiment can be slightly modified and still retain the properties of independent normalization and same final values as now described.

Equation (8) and (9) can be rearranged as $$\underline{\alpha}_t(m) = \text{max-of-}2\{\underline{\alpha}_{t-1}(m^0) + Y^0_{t-1}(m), \underline{\alpha}_{t-1}(m^1) + Y^1_{t-1}(m^1)\} \qquad (16)$$

and $$\alpha_t(m) = \underline{\alpha}_t(m) - A_t - (A_1 + A_2 + \ldots + A_{t-1}) \qquad (17)$$

This shortens the procedure in (8) and makes the procedure in (9) longer, but the effect is the same.

Similarly, equations (10) and (11) can be rearranged as $$\underline{\beta}_t(m) = \text{max-of-}2\{\underline{\alpha}_{t+1}(m^0) + Y^0_t(m), \underline{\beta}_{t+1}(m^1) + Y^1_t(m)\} \qquad (18)$$

$$\beta_t(m) = \underline{\beta}_t(m) - B_t - (B_1 + B_2 + \ldots + B_{t-1}) \qquad (19)$$

The stages S1m and S3m are still the same, but S2m and S4m are slightly different. For example, for α computation of second embodiment, the four stages are S1m$_2$(t): Compute $Y^0_{t-1}(m^0)$ and $Y^1_{t-1}(m^1)$ using Table 1

S2m$_2$(t): Compute $\underline{\alpha}_t(m)$ using equation (16)

S3m$_2$(t): Compute $A_t$ using one of the equations (3a), (3b), (3c)

S4m$_2$(t): Compute $\alpha_t(m)$ using equation (17), and store $(A_1 + A_2 + \ldots + A_t)$ for future use (in the next symbol sequence t+1)

Compared with the prior art, the length of time taken for these modified stages is almost the same. S1 and S1m$_2$ take exactly the same computation time, and so do the pair S2 and S2m and the pair S3 and S3m. S4m$_2$ is only two times longer than S4 because instead of subtracting one constant, S4m$_2$ subtracts two constants (the second one is the stored value from the previous S4m$_2$ symbol).

In general, the length of time taken to complete the stages given L number of symbols is $$Tm = T1m + T2m + T3m + L \times T4m \qquad (20)$$

By comparing with the prior art, we can substitute T1=T1m, T2=T2m, T3=T3m, and T4=T4m/2, and obtain $$T = T1m + L(T2m + T3m + T4m/2) \qquad (21)$$

The number of times of improvement in speed compared with the prior art is $$T/Tm = (T1m + L(T2m + T3m + T4m/2))/(T1m + T2m + T3m + L \times T4m) \qquad (22)$$

For there to be an improvement in speed, the ratio T/Tm must be more than one. Further simplification of T/Tm>1 yields $$L > 1 + (T2m/2)/(T2m + T3m - T4m/2) \qquad (23)$$

It can be seen from equation (23) that there will be an improvement in speed as long as the frame size, L, is not one, as the ratio $(T2m/2)/(T2m + T3m - T4m/2)$ is likely to be less than one. Practically, this means that there will be an improvement at any frame size.

Figure 3:
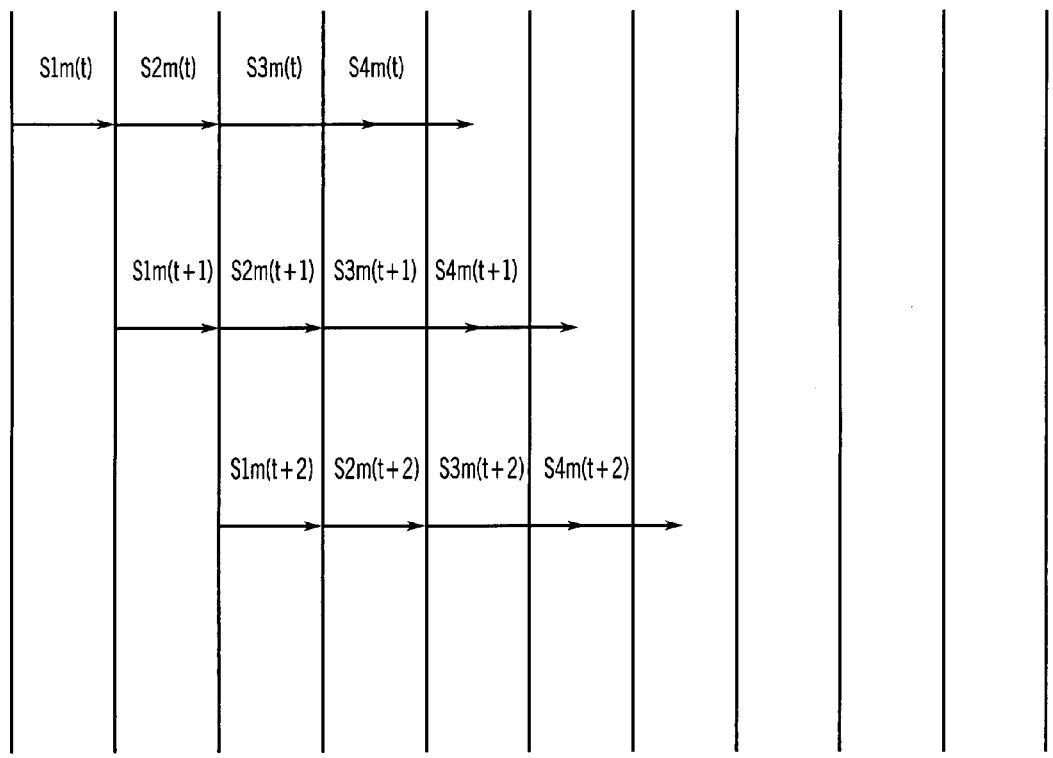
FIG. 3 illustrates a timing diagram of the four stages of α/β computation for three symbols in a pipelining implementation according to a second embodiment of the invention.

FIG. 3 illustrates an example of the timeline of the improved pipelining implementation according to the second embodiment of the present invention. In FIG. 3, it is assumed that the length of time taken for the stages S1m–S4m follows the proportion of T1m:T2m:T3m:T4m=1:1.5:1. Using the above proportion in equation (22), the number of times of improvement in speed approaches 3 for large L.

However, the improvement should be larger in the case where S3 is computed using a more complex method such as in equations (3a) and (3b), because a relatively large T3 produces a large T/Tm ratio.

This algorithm may still significantly faster than the prior art.

The modification of α/β computation in the max-log-MAP algorithm as explained in the first and second embodiments can also be applied to a BCJR (full-MAP) algorithm, or a log-MAP algorithm. Furthermore, the algorithm may be applied to the calculation of α or β or both.

In summary, a method for calculating decoding signals in a MAP algorithm, such as max-log-MAP algorithm, has been disclosed. The above-described embodiments of the invention are intended to be illustrative only. Numerous alternative embodiments may be devised by those skilled in the art without departing from the scope of the following claims.

The invention claimed is:

1. A method of calculating internal signals for use in a MAP algorithm, comprising the steps of:
   obtaining first decoding signals by processing received systematic and received encoded symbols of each symbol sequence of a received signal;
   obtaining unnormalized second decoding signals for the current symbol sequence by processing the first decoding signals of the previous sequence and second decoding signals of the previous sequence;
   obtaining unnormalized third decoding signals for the current symbol sequence by processing the first decoding signals of the current sequence and third decoding signals of the next sequence;
   normalizing the unnormalized second and third decoding signals;
   wherein said second decoding signals of the previous sequence and said third decoding signals of the next sequence are unnormalized; and
   wherein the calculation of the internal signals is pipelined whereby the calculation for the next symbol sequence is commenced once the unnormalized signals for the current symbol sequence have been calculated.

2. A method according to claim 1, wherein said first decoding signals are of two types, one type being associated with the probability of a said systematic symbol being 0 and the other type being associated with the probability of a said systematic symbol being 1.

3. A method according to claim 2, wherein the step of obtaining current unnormalized second decoding signals is implemented by:

$$\underline{\alpha}_t(m)=\text{max-of-2}\{\underline{\alpha}_{t-1}(m^0)+Y^0_{t-1}(m^0), \underline{\alpha}_{t-1}(m^1)+Y^1_{t-1}(m^1)\}-A_{t-1}$$

where $\underline{\alpha}_t(m)$ are said current unnormalized second decoding signals for states $\underline{\alpha}_{t-1}(m^0)$ and $\underline{\alpha}_{t-1}(m^1)$ are respectively said prior unnormalized second decoding signals, for states $m^0$ and $m^1$, $Y^0_{t-1}(m^0)$ and $Y_{t-1}(m^1)$ are respectively said two types of said prior first decoding signals for states $m^0$ and $m^1$, $A_{t-1}$ is a second decoding signal constant for a previous time period, wherein said states $m^0$ and $m^1$ are selected from said states m.

4. A method according to claim 3, wherein the step of normalizing said second decoding signal comprises the step of calculating:

$$\alpha_t(m)=\underline{\alpha}_t(m)-A_t$$

where, $\alpha_t(m)$ are said current second decoding signals for states m, $\underline{\alpha}_t(m)$ are said unnormalized second decoding signals for states m, $A_t$ is a second decoding signal constant for the current period.

5. A method according to claim 4, wherein said second decoding signal constant for the current period $A_t$ is one of:
   $A_t=$max-of-all states $\{\underline{\alpha}_t(m)\}$
   $A_t=$max-of-all states $\{\underline{\alpha}_t(m)\}+$min-of-all states$\{\underline{\alpha}_t(m)\})/2$
   $A_t=\underline{\alpha}_t(0)$
where $\underline{\alpha}_t(m)$ is said unnormalized second decoding signals for states m.

6. A method according to claim 3, further comprising a step of setting the initial values of said unnormalized second decoding signals to selected constants.

7. A method according to claim 2, wherein the step of obtaining current unnormalized second decoding signals is implemented by:

$$\underline{\alpha}_t(m)=\text{max-of-2}\{\underline{\alpha}_{t-1}(m^0)+Y^0_{t-1}(m^0), \underline{\alpha}_{t-1}(m^1)+Y^1_{t-1}(m^1)\}$$

where $\underline{\alpha}_t(m)$ are said current unnormalized second decoding signals for states m, $\underline{\alpha}_{t-1}(m^0)$ and $\underline{\alpha}_{t-1}(m^1)$ are respectively said prior unnormalized second decoding signals, for states $m^0$ and $m^1$, $Y^0_{t-1}(m^0)$ and $Y^1_{t-1}(m^1)$ are respectively said two types of said prior first decoding signals for states $m^0$ and $m^1$, wherein said states $m^0$ and $m^1$ are selected from said states m.

8. A method according to claim 7, wherein said step of normalizing said current second decoding signal comprises the step of calculating:

$$\alpha_t(m)=\underline{\alpha}_t(m)-A_t-(A_1+A_2+\ldots+A_{t-1})$$

where, $\alpha_t(m)$ is said current second decoding signals for states m, $\underline{\alpha}_t(m)$ is said unnormalized second decoding signals for states m, and $A_1, A_2, \ldots, A_{t-1}$ and $A_1$, are respectively second decoding signal constants for the first to current periods.

9. A method according to claim 2, wherein the step of obtaining said unnormalized third decoding signals is implemented by:

$$\underline{\beta}_t(m)=\text{max-of-2}\{\underline{\beta}_{t+1}(m^0)+Y^0_t(m), \underline{\beta}_{t+1}(m^1)+Y^1_t(m)\}-B_{t-1}$$

where $\underline{\beta}_t(m)$ are the unnormalized third decoding signals for states m, $\underline{\beta}_{t+1}(m^0)$ and $\underline{\beta}_{t+1}(m^1)$ are respectively two values of the future unnorinalized third decoding signals for states $m^0$ and states $m^1$, $Y^0_t(m)$ and $Y^1_t(m)$ are respectively said two types of said current first decoding signals for states m, $B_{t-1}$ is a third decoding signal constant for a prior period and said states $m^0$ and $m^1$ m are selected from said states m.

10. A method according to claim 9, wherein said step of normalizing said third decoding signals is implemented by calculating $$\beta_t(m)=\underline{\beta}_t(m)-B_t$$

where, $\beta_t(m)$ are the current third decoding signals for states $\underline{\beta}_t(m)$ are the current unnormalized third decoding signals for states m, and $B_t$ is the current third decoding signal constant.

11. A method according to claim 10, wherein the third decoding signal constant $B_1$ for the current period is:
   $B_t=$max-of-all states $\{\underline{\beta}_t(m)\}$
   $B_t=($max-of-all states $\{\underline{\beta}_t(m)\}+$min-of-all states $\{\underline{\beta}_t(m)\})/2$
   $B_t=\underline{\beta}_t(0)$
where $\underline{\beta}_t(m)$ are the current unnormalized third decoding signals for states m.

12. A method according to claim 9, wherein further comprising a step of setting the initial values of said unnormalized third decoding signals to selected constants.

13. A method according to claim 2, wherein the step of obtaining said unnormalized third decoding signals is implemented by:

$$\beta_t(m) = \text{max-of-2}\{\beta_{t+1}(m^0) + Y^0_t(m), \beta_{t+1}(m^1) + Y^1_t(m)\}$$

where $\beta_t(m)$ are the current unnormalized third decoding signals for states m, $\beta_{t+1}(m^0)$ and $\beta_{t+1}(m^1)$ are respectively two values of the future unnorinalized third decoding signal for states $m^0$ and $m^1$, $Y^0_t(m)$ and $Y^1_t(m)$ are respectively said two types of the current first decoding signals, wherein said states $m^0$ and $m^1$ are selected from said states m.

14. A method according to claim 13, wherein said step of normalizing said third decoding signal comprises the step of calculating $$\beta_t(m) = \underline{\beta}_t(m) - B_t - (B_1 + B_2 + \ldots + B_{t-1})$$

where, $\beta_t(m)$ are the current third decoding signal for states m, $\underline{\beta}_t(m)$ are unnormalized third decoding signal for states m, and $B_1, B_2, \ldots, B_{t-1}$ are respectively third decoding signal constants for the first to current periods.

15. A method according to claim 1 wherein both of said second decoding signals of the previous sequence and said third decoding signals of the next sequence are unnormalized.

* * * * *

UNITED STATES PATENT AND TRADEMARK OFFICE
CERTIFICATE OF CORRECTION

PATENT NO.        : 7,237,177 B2
APPLICATION NO. : 10/727910
DATED               : June 26, 2007
INVENTOR(S)      : Pan et al.

It is certified that error appears in the above-identified patent and that said Letters Patent is hereby corrected as shown below:

Column 1, line 45, "Y" should be "$\Upsilon$".

Column 1, line 50, "Y values: $Y^0$" should be --$\Upsilon$ values: $\Upsilon^0$--.

Column 1, line 51, "$Y^1$" should be --$\Upsilon^1$--.

Column 1, line 53, "Y is" should be --$\Upsilon$ is--.

Column 1, line 53, "Y and" should be --$\Upsilon$ and--.

Column 1, line 55, "Y" should be --$\Upsilon$--.

Column 1, line 56, "Y0 and Y1" should be --$\Upsilon$0 and $\Upsilon$1--.

Column 2, line 4, "Y" should be --$\Upsilon$--.

Column 2, line 5, "$Y^0_t(m)\ Y^1_t(m)$" should be --$\Upsilon^0_t(m)\ \Upsilon^1_t(m)$--.

Column 2, line 16, "Y" should be --$\Upsilon$--.

Column 2, line 21, equation (1) "$Y^t_{t-1}$" should be --$\Upsilon^t_{t-1}$--.

Column 2, line 61, equation (4), "$Y^0_t(m)$" should be --$\Upsilon^0_t(m)$--.

Column 2, line 61, equation (4), "$Y^1_t(m)$" should be --$\Upsilon^1_t(m)$--.

Column 3, line 21, "Y" should be --$\Upsilon$--.

Column 3, line 23, equation (6), "$Y^1_t(m)$" should be --$\Upsilon^1_t(m)$--.

Column 3, line 24, equation (6), "$Y^0_t(m)$" should be --$\Upsilon^0_t(m)$--.

Column 3, line 44, "$Y^0_{t-1}(m^0)$" should be --$\Upsilon^1_{t-1}(m^1)$--.

UNITED STATES PATENT AND TRADEMARK OFFICE
CERTIFICATE OF CORRECTION

PATENT NO. : 7,237,177 B2
APPLICATION NO. : 10/727910
DATED : June 26, 2007
INVENTOR(S) : Pan et al.

It is certified that error appears in the above-identified patent and that said Letters Patent is hereby corrected as shown below:

Column 4, line 16, "unnorinalized" should be --unnormalized--.

Column 4, line 44, "$Y^0_{t-1}(m^0)$ and $Y^0_{t-1}(m^0)$" should be --$\Upsilon^0_{t-1}(m^0)$ and $\Upsilon^1_{t-1}(m^1)$--.

Column 4, line 64, "$Y^0_{t-1}(m^0)$ and $Y^1_{t-1}(m^1)$" should be --$\Upsilon^0_{t-1}(m^0)$ and $\Upsilon^1_{t-1}(m^1)$--.

Column 5, line 25, "$Y^1_t(m)$" should be --$\Upsilon^1_t(m)$--.

Column 5, line 30, "$Y^1_t(m)$ and $Y^1_t(m)$" should be --$\Upsilon^0_t(m)$ and $\Upsilon^1_t(m)$--.

Column 5, line 46, "$Y^1_t(m)$" should be --$\Upsilon^1_t(m)$--.

Column 5, line 51, "$Y^0_t(m)$ and $Y^1_t(m)$" should be --$\Upsilon^0_t(m)$ and $\Upsilon^1_t(m)$--.

Column 6, line 53, "$Y^0_t(m^0)$" should be --$\Upsilon^0_t(m^0)$--.

Column 7, line 3, "$Y^0_{t-1}(m^0)$ and $Y^1_{t-1}(m^1)$" should be --$\Upsilon^0_{t-1}(m^0)$ and $\Upsilon^1_{t-1}(m^1)$--.

Column 8, line 6, equation (16), "$Y^0_{t-1}(m)$" should be --$\Upsilon^0_{t-1}(m)$--.

Column 8, line 7, equation (16), "$Y^1_{t-1}(m)$" should be --$\Upsilon^1_{t-1}(m^1)$--.

Column 8, line 16, equation (18), "$Y^0_t(m)$" should be --$\Upsilon^0_t(m)$--.

Column 8, line 16, equation (18), "$Y^1_t(m)$" should be --$\Upsilon^1_t(m)$--.

Column 8, line 23, "$Y^0_{t-1}(m^0)$ and $Y^1_{t-1}(m^1)$" should be --$\Upsilon^0_{t-1}(m^0)$ and $\Upsilon^1_{t-1}(m^1)$--.

Column 9, claim 3, line 54, "$Y^1_{t-1}(m^1)$" should be --$\Upsilon^1_{t-1}(m^1)$--.

Column 9, claim 3, line 58, "$Y^0_{t-1}(m^0)$ and $Y_{t-1}(m^1)$" should be --$\Upsilon^0_{t-1}(m^0)$ and $\Upsilon^1_{t-1}(m^1)$--.

Column 10, claim 7, line 18, "$Y^0_{t-1}(m^0)$" should be --$\Upsilon^0_{t-1}(m^0)$--.

Column 10, claim 7, line 19, "$Y^1_{t-1}(m^1)$" should be --$\Upsilon^1_{t-1}(m^1)$--.

UNITED STATES PATENT AND TRADEMARK OFFICE
CERTIFICATE OF CORRECTION

PATENT NO. : 7,237,177 B2
APPLICATION NO. : 10/727910
DATED : June 26, 2007
INVENTOR(S) : Pan et al.

It is certified that error appears in the above-identified patent and that said Letters Patent is hereby corrected as shown below:

Column 10, claim 7, line 24, "$Y^0_{t-1}(m^0)$ and $Y^1_{t-1}(m^1)$" should be --$\Upsilon^0_{t-1}(m^0)$ and $\Upsilon^1_{t-1}(m^1)$--.

Column 10, claim 9, line 46, "unnorinalized" should be --unnormalized--.

Column 10, claim 9, line 47, "$Y^0_t(m)$ and $Y^1_t(m)$" should be --$\Upsilon^0_t(m)$ and $\Upsilon^1_t(m)$--.

Column 11, claim 13, line 7, "$Y^0_t(m)$" should be --$\Upsilon^0_t(m)$--.

Column 11, claim 13, line 7, "$Y^1_t(m)$" should be --$\Upsilon^1_t(m)$--.

Column 11, claim 13, line 12, "$Y^0_t(m)$ and $Y^1_t(m)$" should be --$\Upsilon^0_t(m)$ and $\Upsilon^1_t(m)$--.

Signed and Sealed this

Twentieth Day of November, 2007

JON W. DUDAS
*Director of the United States Patent and Trademark Office*